(12) United States Patent
Jeong et al.

(10) Patent No.: US 11,558,027 B2
(45) Date of Patent: Jan. 17, 2023

(54) BULK-ACOUSTIC WAVE RESONATOR

(71) Applicant: Samsung Electro-Mechanics Co., Ltd., Suwon-si (KR)

(72) Inventors: Dae Hun Jeong, Suwon-si (KR); Sung Wook Kim, Suwon-si (KR); Sang Uk Son, Suwon-si (KR); Sang Heon Han, Suwon-si (KR); Won Han, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 968 days.

(21) Appl. No.: 16/362,743

(22) Filed: Mar. 25, 2019

(65) Prior Publication Data
US 2020/0052674 A1     Feb. 13, 2020

(30) Foreign Application Priority Data
Aug. 9, 2018     (KR) .................... 10-2018-0093001

(51) Int. Cl.
| | | |
|---|---|---|
| H01L 41/00 | (2013.01) | |
| H02N 2/00 | (2006.01) | |
| H03H 9/02 | (2006.01) | |
| H03H 9/17 | (2006.01) | |
| H03H 9/13 | (2006.01) | |

(52) U.S. Cl.
CPC .......... *H03H 9/0211* (2013.01); *H03H 9/132* (2013.01); *H03H 9/174* (2013.01)

(58) Field of Classification Search
CPC ...... H03H 9/0211; H03H 9/132; H03H 9/174; H03H 9/173; H03H 9/02118; H03H 3/02; H03H 9/02; H03H 9/02015; H03H 9/02047; H03H 9/131; H03H 2003/023; H03H 2009/02188; H03H 9/25; H03H 9/02614; H03H 9/171
USPC ........................................................ 310/348
See application file for complete search history.

(56) References Cited

U.S. PATENT DOCUMENTS

| | | |
|---|---|---|
| 9,136,818 B2 | 9/2015 | Burak et al. |
| 2012/0161902 A1 | 6/2012 | Feng et al. |
| 2014/0339959 A1 | 11/2014 | Lee et al. |
| 2018/0254764 A1 | 9/2018 | Lee et al. |

FOREIGN PATENT DOCUMENTS

| | | |
|---|---|---|
| JP | 2013-138425 A | 7/2013 |
| KR | 10-2013-0044905 A | 5/2013 |
| KR | 10-2018-0101129 A | 9/2018 |

*Primary Examiner* — Richard Tan
(74) *Attorney, Agent, or Firm* — NSIP Law

(57) ABSTRACT

A bulk-acoustic wave resonator includes: a substrate; a membrane layer forming a cavity with the substrate; a lower electrode disposed on the membrane layer; an insertion layer disposed to cover at least a portion of the lower electrode; a piezoelectric layer disposed on the lower electrode to cover the insertion layer; and an upper electrode at least partially disposed on the piezoelectric layer, wherein the upper electrode includes a reflection groove disposed on the insertion layer.

17 Claims, 6 Drawing Sheets

BULK-ACOUSTIC WAVE RESONATOR

CROSS-REFERENCE TO RELATED APPLICATIONS

This application claims the benefit under 35 U.S.C. § 119(a) of Korean Patent Application No. 10-2018-0093001 filed on Aug. 9, 2018 in the Korean Intellectual Property Office, the entire disclosure of which is incorporated herein by reference for all purposes.

BACKGROUND

1. Field

The following description relates to a bulk-acoustic wave resonator.

2. Description of Related Art

A conventional bulk-acoustic wave resonator is composed of a stacked structure having respective electrodes in positions higher and lower than a position of a piezoelectric element. In addition, a transverse wave (lateral wave) may occur in the operation of the bulk-acoustic wave resonator, and this transverse wave may leak from a resonance portion of the bulk-acoustic wave resonator to cause unnecessary energy loss, thereby deteriorating the performance of the bulk-acoustic wave resonator. To solve this problem, a conventional bulk-acoustic wave resonator may primarily use a structure, such as a reflection layer, for reflecting the transverse wave into the resonance portion.

The reflectance of the reflective layer, with respect to the transverse wave, may vary depending on the structure of the reflective layer. A cross-sectional shape of a portion of the reflective layer disposed outside a resonance portion of the resonator may be different from a cross-sectional shape of a portion of the reflective layer disposed in remaining portion of the resonator. Thus, a reflectance of the portion of the reflective layer disposed outside the resonance portion of the resonator may be different from a reflectance of the portion of reflective layer disposed in the remaining portion of the resonator. In other words, there is a problem of portions of the reflective layer disposed to surround the resonance portion by a portion present outside the resonance portion having different levels of transverse reflectance from each other.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a bulk-acoustic wave resonator includes: a substrate; a membrane layer forming a cavity with the substrate; a lower electrode disposed on the membrane layer; an insertion layer disposed to cover at least a portion of the lower electrode; a piezoelectric layer disposed on the lower electrode to cover the insertion layer; and an upper electrode at least partially disposed on the piezoelectric layer, wherein the upper electrode includes a reflection groove disposed on the insertion layer.

An end of the upper electrode disposed in an active region in which the lower electrode, the piezoelectric layer, and the upper electrode overlap may be disposed on the insertion layer.

The end of the upper electrode disposed in the active region, and the reflection groove may be connected to form a closed and curved shape.

An end of the reflection groove may be disposed in a position higher than a position of an inclined surface of the insertion layer.

The bulk-acoustic wave resonator may further include a protection layer, wherein at least a portion of the protection layer is disposed in a position higher than a position of the upper electrode.

The bulk-acoustic wave resonator may further include an etching prevention portion disposed to surround the cavity.

The bulk-acoustic wave resonator may further include a sacrificial layer disposed outside the etching prevention portion.

The piezoelectric layer may include a piezoelectric portion disposed in a flat portion of the piezoelectric layer, and a bent portion extending from the piezoelectric portion and disposed in an extension portion of the piezoelectric layer.

The reflection groove may be disposed on the bent portion.

The reflection groove may be disposed in a peripheral portion of an active region of the bulk-acoustic wave resonator.

In another general aspect, a bulk-acoustic wave resonator includes: a substrate; a lower electrode disposed on the substrate; a piezoelectric layer comprising a piezoelectric portion disposed to cover the lower electrode, and a bent portion having an inclined surface, and having a thickness greater than a thickness of the piezoelectric portion; an upper electrode, at least a portion of the upper electrode being disposed in a position higher than a position of the piezoelectric layer; and a reflection groove disposed on the upper electrode, and disposed in a position higher than a position of the bent portion.

An end of the reflection groove may be disposed in a position higher than a position of the inclined surface of the bent portion.

The reflection groove and an end of the upper electrode disposed in an active region in which the lower electrode, the piezoelectric layer, and the upper electrode are overlapped may be connected to each other to form a closed and curved shape.

The reflection groove may be configured to form a reflector in a peripheral portion of an active region of the bulk-acoustic wave resonator Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
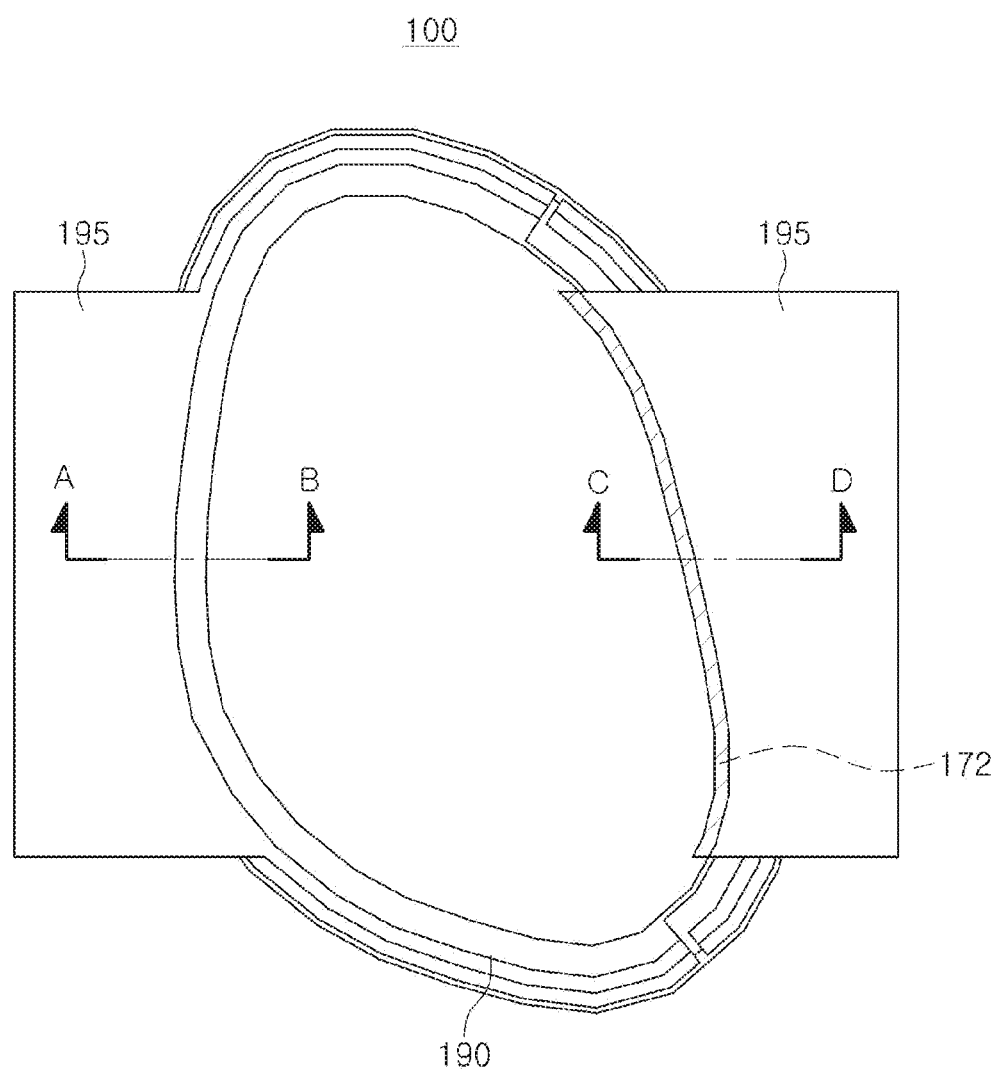
FIG. 1 is a plan view illustrating a bulk-acoustic wave resonator, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2:
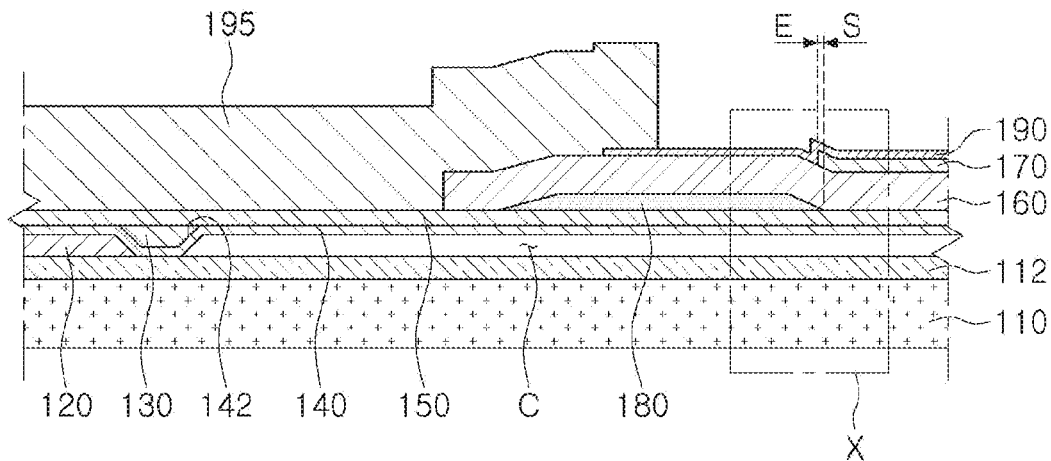
FIG. 2 is a cross-sectional view taken along line A-B in FIG. 1.
Figure 3:
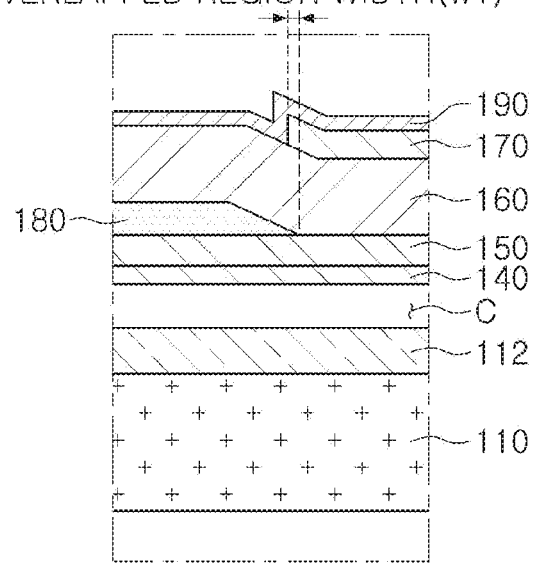
FIG. 3 is an enlarged view of portion X in FIG. 2.
Figure 4:
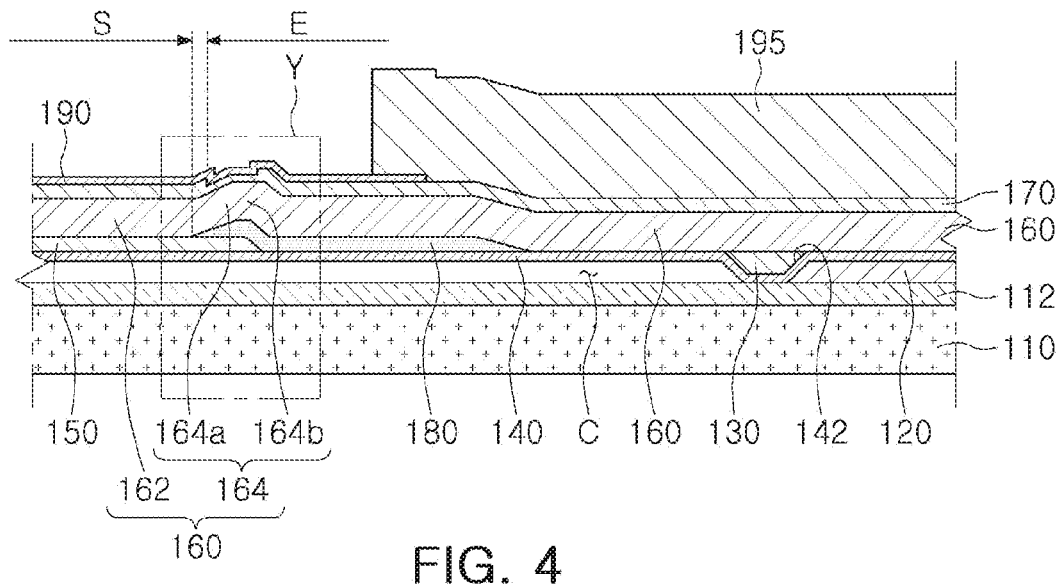
FIG. 4 is a cross-sectional view taken along line C-D in FIG. 1.
Figure 5:
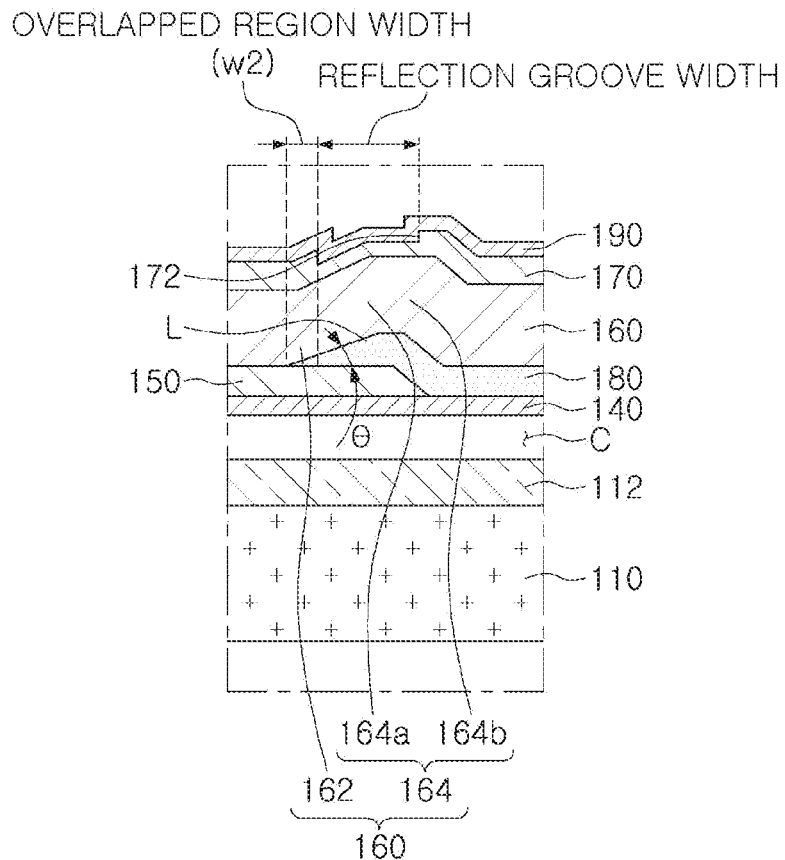
FIG. 5 is an enlarged view of portion Y in FIG. 4.

FIG. 1 is a plan view illustrating a bulk-acoustic wave resonator 100, according to an embodiment. FIG. 2 is a cross-sectional view taken along line A-B in FIG. 1. FIG. 3 is an enlarged view of portion X in FIG. 2. FIG. 4 is a cross-sectional view taken along line C-D in FIG. 1. FIG. 5 is an enlarged view of portion Y in FIG. 4.

Referring to FIGS. 1 to 5, the bulk-acoustic wave resonator 100 may include a substrate 110, a sacrificial layer 120, an etching prevention portion 130, a membrane layer 140, a lower electrode 150, a piezoelectric layer 160, an upper electrode 170, an insertion layer 180, a protection layer 190, and a metal pad 195.

The substrate 110 may be a silicon substrate. For example, a silicon wafer may be used as the substrate 110. Alternatively, a silicon on insulator (SOI) type substrate may be used as the substrate 110.

An insulation layer 112 may be formed on an upper surface of the substrate 110, and may electrically isolate the substrate 110 from layers formed in a position higher than a position of the substrate. The insulation layer 112 may also prevent the substrate 110 from being etched by an etching gas, when a cavity C is formed during the manufacturing process.

For example, the insulation layer 112 may be formed of at least one of silicon dioxide ($SiO_2$), silicon nitride ($Si_3N_4$), aluminum oxide ($Al_2O_3$), and aluminum nitride (AlN), and may be formed by at least one of a chemical vapor deposition process, a RF magnetron sputtering process, and an evaporation process.

The sacrificial layer 120 may be formed on the insulation layer 112, and the cavity C and the etching prevention portion 130 may be disposed inside the sacrificial layer 120. The cavity C may be formed by removing a portion of the sacrificial layer 120 during the manufacturing process. As described above, because the cavity C is formed inside the sacrificial layer 120, the lower electrode 150, the piezoelectric layer 160, the upper electrode 170, and other layers disposed in a position higher than a position of the sacrificial layer 120 may be formed in a flat shape.

The etching prevention portion 130 may be disposed along a horizontal boundary of the cavity C. The etching prevention portion 130 may prevent etching from proceeding beyond an area of the cavity in a process of forming the cavity C.

The membrane layer 140 may form the cavity C together with the substrate 110. In addition, the membrane layer 140 may be formed of a material having a low reactivity with the etching gas, when the sacrificial layer 120 is removed. The etching prevention portion 130 may be inserted into a groove 142 formed by the membrane layer 140. A dielectric layer containing any one of silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO) may be used as the membrane layer 140.

A seed layer (not illustrated) formed of aluminum nitride (AlN) may be formed on the membrane layer 140. For example, the seed layer may be disposed between the membrane layer 140 and the lower electrode 150. The seed layer may be formed of a dielectric or a metal having an HCP crystal structure in addition to aluminum nitride (AlN). As an example, when the seed layer is formed of a metal, the seed layer may be formed of titanium (Ti).

A lower electrode 150 may be formed on the membrane layer 140, and a portion of the lower electrode 150 may be disposed on an upper portion of the cavity C. In addition, the lower electrode 150 may be either an input electrode or an output electrode used for inputting or outputting, respectively, an electrical signal such as an RF (Radio Frequency) signal, and the like.

The lower electrode 150 may be formed of, for example, an electrically conductive material such as molybdenum (Mo), or an alloy of Mo. The present disclosure is not limited this example, and the lower electrode 150 may be formed of an electrically conductive material such as ruthenium (Ru), tungsten (W), iridium (Ir), platinum (Pt), copper (Cu), titanium (Ti), tantalum (Ta), nickel (Ni), chromium (Cr), and the like, or an alloy of Ru, W, Ir, Pt, Cu, Ti, Ta, Ni, or Cr.

The piezoelectric layer 160 may be formed to cover at least the lower electrode 150, which is disposed in a position higher than a position of the cavity C. The piezoelectric layer 160 may be configured to cause a piezoelectric effect to convert electrical energy into mechanical energy in the form of an acoustic wave, and may be formed of any one of aluminum nitride (AlN), zinc oxide (ZnO), and lead zirconium titanate (PZT; PbZrTiO). For example, when the piezoelectric layer 160 is formed of aluminum nitride (AlN), the piezoelectric layer 160 may further include a rare earth metal. As an example, the rare earth metal may include any one or any combination of any two or more of scandium (Sc), erbium (Er), yttrium (Y), and lanthanum (La). In addition, as an example, the transition metal may include any one or any combination of any two or more of titanium (Ti), zirconium (Zr), hafnium (Hf), tantalum (Ta), and niobium (Nb). Magnesium (Mg), which is a divalent metal, may also be included in the piezoelectric layer 160.

The piezoelectric layer 160 may include a piezoelectric portion 162 disposed in a flat portion S, and a bent portion 164 disposed in an extension portion E.

Referring to FIG. 4, piezoelectric portion 162 may be directly stacked on the upper surface of the lower electrode 150. Therefore, the piezoelectric portion 162 may be disposed between the lower electrode 150 and the upper electrode 170, and may be formed in a flat shape, together with the lower electrode 150 and the upper electrode 170.

Still referring to FIG. 4, the bent portion 164 may be a portion extending in an outward direction from the piezoelectric portion 162, and may be located in the extension portion E.

As shown in FIGS. 4 and 5, the bent portion 164 may be disposed on the insertion layer 180 to be described later, and may be formed in a shape raising along a shape of the insertion layer 180. The piezoelectric layer 160 may be bent at the boundary between the piezoelectric portion 162 and the bent portion 164, and the bent portion 164 may be raised, corresponding to a thickness and a shape of the insertion layer 180.

Still referring to FIGS. 4 and 5, the bent portion 164 may include an inclined portion 164a and an extended portion 164b. The inclined portion 164a is a portion formed to be inclined along an inclined surface L of the insertion layer 180 to be described later. The extended portion 164b is a portion extending in an outward direction from the inclined portion 164a.

Referring to FIG. 5, the inclined portion 164a may be formed to be parallel to the inclined surface L of the insertion layer 180, and an inclination angle of the inclined portion 164a may be equal to an inclination angle θ of the inclined surface L.

Referring to FIGS. 2-5, the upper electrode 170 may be formed to cover at least the piezoelectric layer 160, and may be formed to cover additional layers disposed in a position higher than a position of the cavity C. The upper electrode 170 may be used as either an input electrode or an output electrode for inputting or outputting, respectively, an electrical signal such as an RF (Radio Frequency) signal, and the like. For example, when the lower electrode 150 is used as an input electrode, the upper electrode 170 may be used as an output electrode, and when the lower electrode 150 is used as an output electrode, the upper electrode 170 may be used as an input electrode.

The upper electrode 170 may be formed of, for example, an electrically conductive material such as molybdenum (Mo), or an alloy thereof. However, the lower electrode 170 is not limited to being formed of Mo, and the upper electrode 170 may be formed of an electrically conductive material such as ruthenium (Ru), tungsten (W), iridium (Ir), platinum (Pt), copper (Cu), titanium (Ti), tantalum (Ta), nickel (Ni), chromium (Cr), or the like, or an alloy of Ru, W, Ir, Pt, Cu, Ti, Ta, Ni, or Cr.

As shown in FIG. 5, the upper electrode 170 may include a reflection groove 172 disposed on the upper portion of the insertion layer 180 to be described later. Further, one end of the reflection groove 172 may be disposed in a position higher than a position of an inclined surface L of the insertion layer 180 to be described later. That is, the one end of the reflection groove 172 may be disposed in a position higher, in a direction perpendicular to a direction of a lateral/transverse wave generated by the bulk-acoustic wave resonator 100, than a position of an inclined surface L of the insertion layer 180. In addition, the other end of the reflection groove 172 may be disposed in a position higher than a position of the extended portion 164b. Moreover, the bottom surface of the reflection groove 172 may have a two-step inclination.

An upper end of the upper electrode 170 is disposed in a position higher (e.g., in the direction perpendicular to the direction of a lateral/transverse wave generated by the bulk-acoustic wave resonator 100) than a position of the insertion layer 180. In addition, the ends of the reflection groove 172 and the upper electrode 170 may form a closed and curved shape, when viewed in a vertical direction (e.g., on an upper surface of the upper electrode 170), as illustrated in FIG. 1.

Since the reflection groove 172 is formed in the upper electrode 170, the reflection groove 172 may form a Bragg reflector together with the end of the upper electrode 170. As a result, the performance of the bulk-acoustic wave resonator 100 may be improved.

Referring to FIGS. 2-5, the insertion layer 180 may be disposed between the lower electrode 150 and the piezoelectric layer 160. The insertion layer 180 may be formed of a dielectric, such as silicon oxide ($SiO_2$), aluminum nitride (AlN), aluminum oxide ($Al_2O_3$), silicon nitride ($Si_3N_4$), manganese oxide (MgO), zirconium oxide ($ZrO_2$), lead zirconate titanate (PZT), gallium arsenide (GaAs), hafnium oxide ($HfO_2$), aluminum oxide ($Al_2O_3$), titanium oxide ($TiO_2$), or zinc oxide (ZnO), but may be formed of a material different from those of the piezoelectric layer 160. In addition, an area in which the insertion layer 180 is provided may be formed as an air space, if necessary. This may be accomplished by removing the insertion layer 180 during the manufacturing process.

For example, a thickness of the insertion layer 180 may be the same as or similar to a thickness of the lower electrode 150. The insertion layer 180 may be formed to be thinner than the piezoelectric layer 160, or may be formed to be similar in thickness to the piezoelectric layer 160. For example, the insertion layer 180 may be formed to have a thickness of 100 Å or more, and may be formed to have a thickness less than a thickness of the piezoelectric layer 160. However, the configuration of the insertion layer 180 is not limited to the examples provided above.

The insertion layer 180 may be disposed along a surface formed by the membrane layer 140, the first electrode 150, and the etching prevention portion 130.

Referring to FIGS. 2 and 4, the insertion layer 180 may be disposed around the flat portion S to support the bent portion 164 of the piezoelectric layer 160. The bent portion 164 of the piezoelectric layer 160 may be divided into the inclined portion 164a and the extended portion 164b, depending on a shape of the insertion layer 180.

Still referring to FIGS. 2 and 4, the insertion layer 180 may be disposed in an area other than the flat portion S. For example, the insertion layer 180 may be disposed over an entire area excluding the flat portion S, or may be disposed in a portion of an area excluding the flat portion S.

As shown in FIGS. 2-5, at least a portion of the insertion layer 180 may be disposed between the piezoelectric layer 160 and the lower electrode 150.

Referring to FIGS. 2 and 4, a side surface of the insertion layer 180 disposed along the boundary of the flat portion S may be formed to have a thickness that increases as a distance from the flat portion S increases. As shown in FIG. 5, the insertion layer 180 include an inclined surface L such that a side surface to be disposed adjacent to the flat portion S has a constant inclination angle θ.

If the inclination angle θ of the side surface of the insertion layer 180 were formed to be less than 5 degrees, a thickness of the insertion layer 180 may be required to be very thin or an area of the inclined surface L may be required to be excessively large, to manufacture the insertion layer 180. Therefore, it may be difficult to implement an insertion layer in which inclination angle θ of the side surface is less than 5 degrees.

In addition, if the inclination angle θ of the side surface of the insertion layer 180 were formed to be greater than 70 degrees, an inclination angle of the inclined portion 164a of the piezoelectric layer 160 stacked on the insertion layer 180 may be formed to be greater than 70 degrees. In this case, since the piezoelectric layer 160 may be excessively bent, a crack may be generated in the bent portion of the piezoelectric layer 160.

Therefore, the inclination angle θ of the inclined surface L may be formed in a range of greater than or equal to 5 degrees and less than or equal to 70 degrees.

Referring to FIGS. 2 and 4, protection layer 190 may be formed in an area excluding a portion of the lower electrode 150 and a portion of the upper electrode 170. The protection layer 190 may prevent damage to the upper electrode 170, the piezoelectric layer 160, and the lower electrode 150 during the manufacturing process.

The protection layer 190 may be partially removed by etching for frequency control in the final process. For example, the thickness of the protection layer 190 may be adjusted. For example, a dielectric layer containing any one material of silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO) may be used as the protection layer 190.

Still referring to FIGS. 2 and 4, the metal pad 195 may be formed on the portion of the lower electrode 150 and the portion of the upper electrode 170 in which the protection layer 190 is not formed. As an example, the metal pad 195 may be made of a material such as gold (Au), gold-tin (Au—Sn) alloy, copper (Cu), copper-tin (Cu—Sn) alloy, aluminum (Al), aluminum alloy, or the like. For example, the aluminum alloy may be an aluminum-germanium (Al—Ge) alloy.

As described above, the performance of the bulk-acoustic wave resonator 100 may be improved through the reflection groove 172 formed in the upper electrode 170. For example, a Bragg reflector may be formed in a portion of a peripheral portion of an active region (that is, a region in which the upper electrode 170, the piezoelectric layer 160, and the lower electrode 150 all overlap) through the reflection groove 172 illustrated in FIGS. 1 to 5. For example, the reflection groove 172 may be formed in a peripheral portion of the active region disposed in a portion extending to the extension portion E to form a Bragg reflector. Therefore, the reflectance of a horizontal wave (e.g., a transverse wave or a lateral wave) may be improved.

A start point, or start region, of the reflection groove 172 (a width W2 of an overlapped region as illustrated in FIG. 5) may be identical to, or substantially the same as, a width W1 of an overlapped region in which the insertion layer 180 and the upper electrode 170 overlap as illustrated in FIG. 3.

Figure 6:
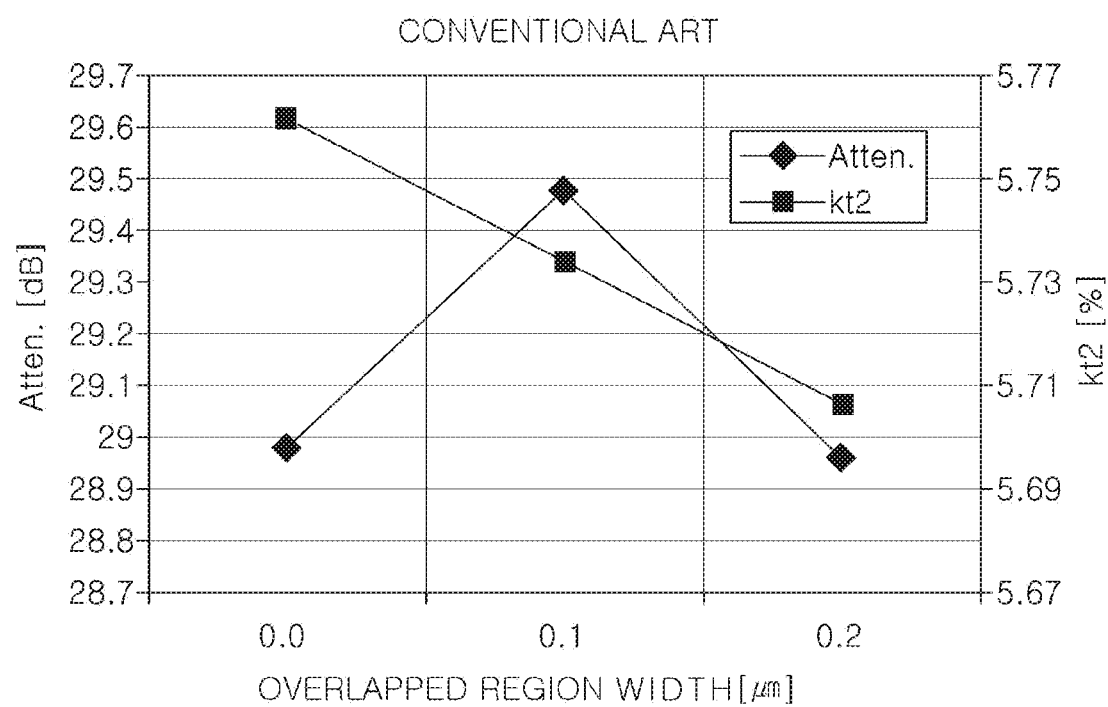
FIG. 6 is a graph illustrating performance of a conventional resonator.

As illustrated in FIG. 6, it can be seen that attenuation performance of a conventional bulk-acoustic wave resonator (e.g., a resonator in which the reflection groove 172 is not formed) may be optimal at a particular overlapped region width. (ex. Overlapped region width is 0.1 μm).

Figure 7:
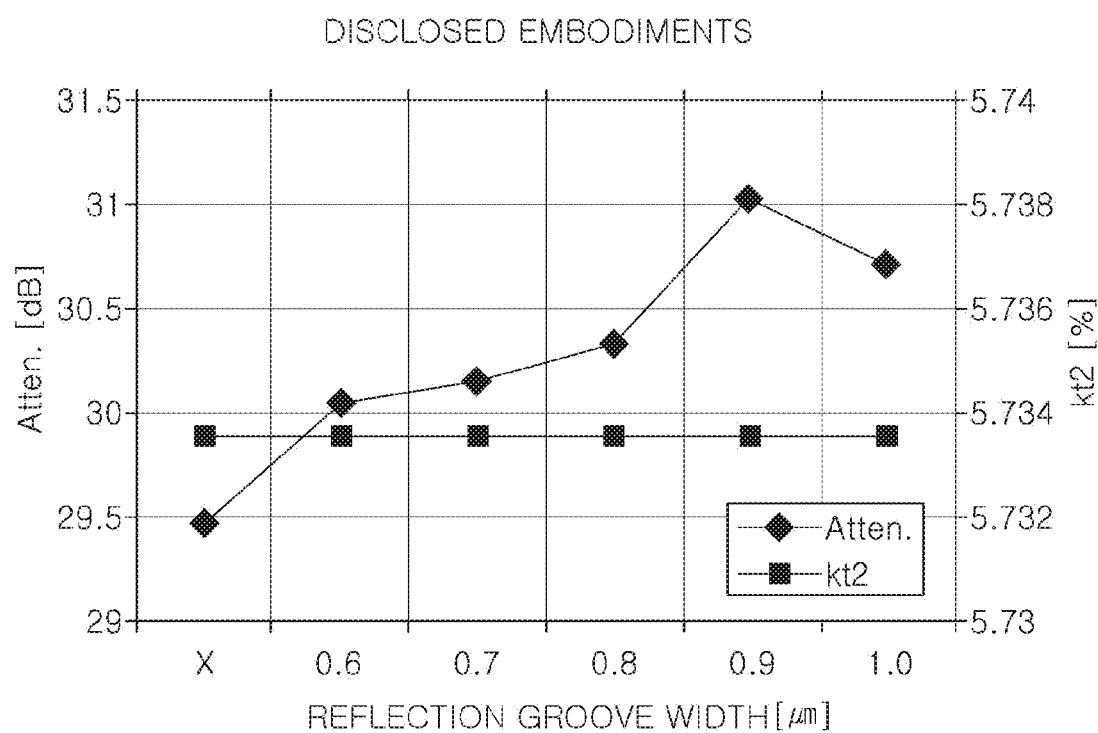
FIG. 7 is a graph illustrating performance of a bulk-acoustic wave resonator according to an embodiment.

In the case of the bulk-acoustic wave resonator 100 disclosed herein, as illustrated in FIG. 7, it can be understood that attenuation performance may be improved by adding the reflection groove 172, and side effects such as $Kt^2$ performance deterioration may not occur.

A bulk-acoustic wave resonator 200, according to an embodiment, is described below with reference to FIG. 8. The same elements as those described above with respect to the bulk-acoustic wave resonator 100 are shown in FIG. 8 by using the reference numerals used above, and, thus, a detailed description of the same elements described above will be omitted.

Figure 8:
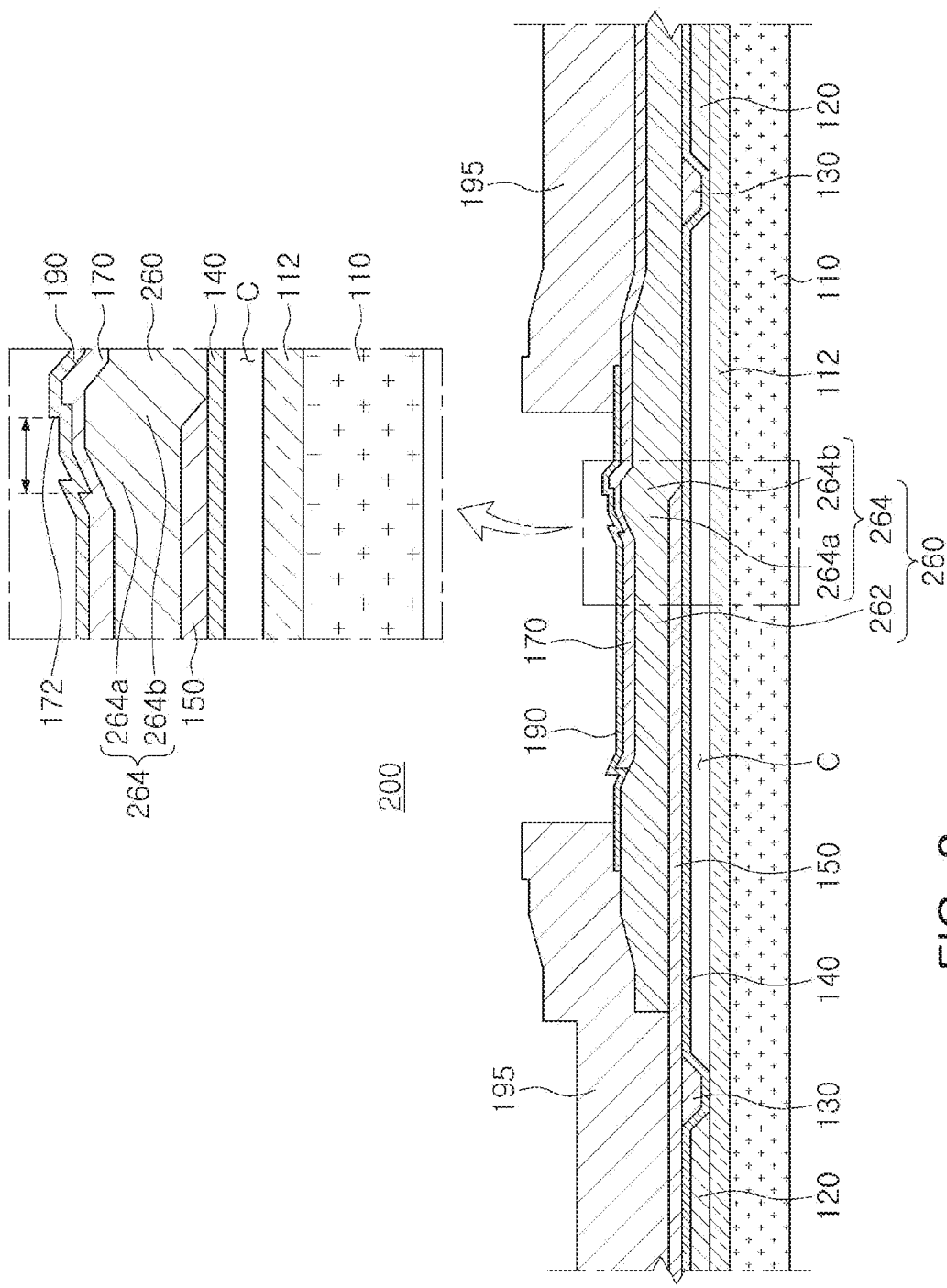
FIG. 8 is a schematic cross-sectional view illustrating a bulk-acoustic wave resonator, according to a second embodiment.

FIG. 8 is a schematic cross-sectional view illustrating the bulk-acoustic wave resonator 200.

Referring to FIG. 8, the bulk-acoustic wave resonator 200 may include a substrate 110, a sacrificial layer 120, an etching prevention portion 130, a membrane layer 140, a lower electrode 150, a piezoelectric layer 260, an upper electrode 170, a protection layer 190, and a metal pad 195.

The piezoelectric layer 260 may be formed to cover at least the lower electrode 150, which is disposed in a position higher than a position of the cavity C. The piezoelectric layer 260 may be configured to cause a piezoelectric effect to convert electrical energy into mechanical energy in the form of an acoustic wave, and may be formed of any one of aluminum nitride (AlN), zinc oxide (ZnO), and lead zirconium titanium oxide (PZT; PbZrTiO). For example, when the piezoelectric layer 260 is formed of aluminum nitride (AlN), the piezoelectric layer 260 may further include a rare earth metal. As an example, the rare earth metal may include any one or any combination of any two or more of scandium (Sc), erbium (Er), yttrium (Y), and lanthanum (La). In addition, as an example, the transition metal may include any one or any combination of any two or more of titanium (Ti), zirconium (Zr), hafnium (Hf), tantalum (Ta), and niobium (Nb). Magnesium (Mg), which is a divalent metal, may also be included in the piezoelectric layer 260.

The piezoelectric layer 260 may include a piezoelectric portion 262 disposed in a flat portion S, and a bent portion 264 disposed in an extension portion E.

The piezoelectric portion 262 may be a portion directly stacked on the upper surface of the lower electrode 150. Therefore, the piezoelectric portion 262 may be disposed between the lower electrode 150 and the upper electrode 170, and may be formed in a flat shape, together with the lower electrode 150 and the upper electrode 170.

The bent portion 264 may be a portion extending in an outward direction from the piezoelectric portion 262, and may be located in the extension portion E.

The bent portion 264 is a portion having a thickness greater than a thickness of the piezoelectric portion 262, and may be bent at the boundary between the piezoelectric portion 262 and the bent portion 264.

The bent portion 264 may include an inclined portion 264a and an extended portion 264b.

The inclined portion 264a is a portion formed to be inclined, and the extending portion 264b is a portion extending in an outward direction from the inclined portion 264a.

The upper electrode 170 may be formed to cover at least the piezoelectric layer 260, which disposed in a position higher than a position of the cavity C. The upper electrode 170 may be used as either an input electrode or an output electrode for inputting or outputting, respectively, an electrical signal such as an RF (Radio Frequency) signal, and the like. For example, when the lower electrode 150 is used as an input electrode, the upper electrode 170 may be used as an output electrode, and when the lower electrode 150 is used as an output electrode, the upper electrode 170 may be used as an input electrode.

The upper electrode 170 may be formed of, for example, a conductive material such as molybdenum (Mo), or an alloy of Mo. The upper electrode is not limited to being formed of Mo, and the upper electrode 170 may be formed of a conductive material such as ruthenium (Ru), tungsten (W), iridium (Ir), platinum (Pt), copper (Cu), titanium (Ti), tantalum (Ta), nickel (Ni), chromium (Cr), and the like, or an alloy of Ru, W, Ir, Pt, Cu, Ti, Ta, Ni, or Cr.

The upper electrode 170 may include a reflection groove 172 disposed on the upper portion of the bent portion 264 of the piezoelectric layer 260. Further, one end of the reflection groove 172 may be disposed in a position higher than a position of the inclined portion 264a of the bent portion 264. That is, the one end of the reflection groove 172 may be disposed in a position higher, in a direction perpendicular to a direction of a lateral/transverse wave generated by the bulk-acoustic wave resonator 200, than a position of an inclined portion 264a. In addition, the other end of the reflection groove 172 may be disposed in a position higher than a position of the extended portion 264b. Moreover, the bottom surface of the reflection groove 172 may have a two-step inclination.

An upper end of the upper electrode 170 is disposed in a position higher (e.g., in the direction perpendicular to the direction of a lateral/transverse wave generated by the bulk-acoustic wave resonator 200) than a position of the extended portion 264b of the bent portion 264. In addition, the ends of the reflection groove 172 and the upper electrode 170 may form a closed and curved shape, when viewed in a vertical direction (e.g., on an upper surface of the upper electrode 170), similar to the illustration in FIG. 1.

Since the reflection groove 172 is formed in the upper electrode 170, the reflection groove 172 may form a Bragg reflector together with the end of the upper electrode 170. As a result, the performance of the bulk-acoustic wave resonator 100 may be improved.

Since the reflection groove 172 is formed in the upper electrode 170, the reflection groove 172 may form a Bragg reflector together with the end of the upper electrode 170. As a result, the performance of the bulk-acoustic wave resonator 200 may be improved.

According to an aspect of this disclosure, energy loss may be reduced to improve attenuation performance of a bulk-acoustic wave resonator.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bulk-acoustic wave resonator, comprising:
a substrate;
a membrane layer forming a cavity with the substrate;
a lower electrode disposed on the membrane layer;
an insertion layer disposed to cover at least a portion of the lower electrode;

a piezoelectric layer disposed on the lower electrode to cover the insertion layer; and an upper electrode at least partially disposed on the piezoelectric layer, wherein the upper electrode comprises a reflection groove disposed on the insertion layer.

2. The bulk-acoustic wave resonator according to claim 1, wherein an end of the upper electrode disposed in an active region in which the lower electrode, the piezoelectric layer, and the upper electrode overlap is disposed on the insertion layer.

3. The bulk-acoustic wave resonator according to claim 2, wherein the end of the upper electrode disposed in the active region, and the reflection groove are connected to form a closed and curved shape.

4. The bulk-acoustic wave resonator according to claim 1, wherein an end of the reflection groove is disposed in a position higher than a position of an inclined surface of the insertion layer.

5. The bulk-acoustic wave resonator according to claim 1, further comprising a protection layer, wherein at least a portion of the protection layer is disposed in a position higher than a position of the upper electrode.

6. The bulk-acoustic wave resonator according to claim 1, further comprising an etching prevention portion disposed to surround the cavity.

7. The bulk-acoustic wave resonator according to claim 6, further comprising a sacrificial layer disposed outside the etching prevention portion.

8. The bulk-acoustic wave resonator according to claim 1, wherein the piezoelectric layer comprises a piezoelectric portion disposed in a flat portion of the piezoelectric layer, and a bent portion extending from the piezoelectric portion and disposed in an extension portion of the piezoelectric layer.

9. The bulk-acoustic wave resonator according to claim 8, wherein the reflection groove is disposed on the bent portion.

10. The bulk-acoustic wave resonator according to claim 1, wherein the reflection groove is disposed in a peripheral portion of an active region of the bulk-acoustic wave resonator.

11. A bulk-acoustic wave resonator, comprising:
a substrate;
a lower electrode disposed on the substrate;
a piezoelectric layer comprising a piezoelectric portion disposed to cover the lower electrode, and a bent portion having an inclined surface, and having a thickness greater than a thickness of the piezoelectric portion;

an upper electrode, at least a portion of the upper electrode being disposed in a position higher than a position of the piezoelectric layer; and a reflection groove disposed on the upper electrode, and disposed in a position higher than a position of the bent portion, wherein the reflection groove and an end of the upper electrode, disposed in an active region in which the lower electrode, the piezoelectric layer, and the upper electrode are overlapped, are connected to each other to form a closed and curved shape.

12. The bulk-acoustic wave resonator according to claim 11, wherein an end of the reflection groove is disposed in a position higher than a position of the inclined surface of the bent portion.

13. The bulk-acoustic wave resonator according to claim 11, wherein the reflection groove is configured to form a reflector in a peripheral portion of an active region of the bulk-acoustic wave resonator.

14. A bulk-acoustic wave resonator, comprising:
a substrate;
a lower electrode disposed on the substrate;
a piezoelectric layer comprising a piezoelectric portion disposed to cover the lower electrode, and a bent portion having at least one inclined surface with a portion protruding above a level of a top surface of the piezoelectric portion, and having a thickness greater than a thickness of the piezoelectric portion;

an upper electrode, at least a portion of the upper electrode being disposed in a position higher than a position of the piezoelectric layer; and a reflection groove disposed on the upper electrode, and disposed in a position higher than a position of the bent portion.

15. The bulk-acoustic wave resonator according to claim 14, wherein the bent portion further extends below a level of a bottom surface of the piezoelectric portion.

16. The bulk-acoustic wave resonator according to claim 14, wherein an end portion of the lower electrode includes an additional inclined surface and the bent portion inclines below a level of a bottom surface of the piezoelectric portion and protrudes above the top surface of the piezoelectric portion at the additional inclined surface.

17. The bulk-acoustic wave resonator according to claim 14, wherein at least one inclined surface of the bent portion includes an inclined top surface and an inclined bottom surface.

* * * * *